United States Patent

[11] 3,621,467

[72] Inventor Frank Dostal
Elmhurst, N.Y.
[21] Appl. No. 815,083
[22] Filed Apr. 10, 1969
[45] Patented Nov. 16, 1971
[73] Assignee Bulova Watch Company, Inc.
New York, N.Y.

[54] AMPLITUDE LIMITER FOR TUNING FORK OSCILLATOR

2 Claims, 6 Drawing Figs.

[52] U.S. Cl. .......... 331/109, 58/23 TF, 84/409, 310/25, 331/116 M, 331/156, 331/183, 350/6, 350/99, 350/269

[51] Int. Cl. .......... H03b 3/02, H03b 5/30

[50] Field of Search .......... 331/116 M, 156, 109, 183; 84/1.15, 409, 457; 310/25; 350/6, 99, 269; 58/23 TF

[56] References Cited

UNITED STATES PATENTS

| | | | |
|---|---|---|---|
| 3,349,262 | 10/1967 | Gibbons | 310/37 |
| 3,382,459 | 5/1968 | Asten | 331/156 |
| 3,469,389 | 9/1969 | Nakai et al. | 331/156 X |
| 3,493,292 | 2/1970 | Dostal | 331/156 X |

*Primary Examiner*—Roy Lake
*Assistant Examiner*—Siegfried H. Grimm
*Attorney*—Michael Ebert

ABSTRACT: A tuning fork oscillator having a pair of tines which are sustained in vibration by an electronic drive system subject to change whereby the amplitude of fork vibration tends also to change. The amplitude is physically stabilized by mechanical stops having damping elements which are disposed to prevent the fork excursion from exceeding a preset limit, the fork being electronically driven by the system to normally exceed said limit whereby the fork amplitude neither falls below nor goes above the preset limit.

INVENTOR.
FRANK DOSTAL
BY
ATTORNEY

AMPLITUDE LIMITER FOR TUNING FORK OSCILLATOR

BACKGROUND OF INVENTION

This invention relates generally to tuning fork oscillators, and more particularly to mechanical amplitude limiters for such oscillators.

The frequency stability of a tuning fork oscillator is generally superior to that of an electrical oscillator operating at the same frequency. A tuning fork vibrates at a frequency determined mainly by the constant physical properties of the tines, whereas the frequency of an electrical oscillator depends on the respective values and characteristics of the capacitors, inductors and tubes or transistors constituting the oscillator circuit, these parameters being subject to change with variations in applied voltage, temperature, aging and other factors.

Tuning fork oscillators have many practical applications and are, for example, currently used as frequency standards, for power line regulation, in guidance systems and as driving elements for optical devices to chop, modulate, scan or otherwise control a beam of light or radiant energy. When the tuning fork is used as a vibrating drive for an optical device, it is often essential that the amplitude be kept constant in spite of changes which may occur in the associated electronic drive circuit or elsewhere. For instance, a fork in vacuo or space will assume a larger amplitude than at standard sea level conditions.

In the typical electronic drive system, the output of an amplifier is applied to a drive coil associated with one tine of the fork to activate the fork, and the signal voltage generated in a pickup coil associated with the other tine is fed to the amplifier input. The resultant positive feedback loop sustains the fork in vibration at its natural frequency.

The amplitude of fork vibration depends on the gain and output power of the amplifier and these tend to vary as a function of temperature, voltage and other factors. Variations in physical properties of fork material with temperature and changes in resistance of the pickup and drive coils also contribute to changes in amplitude.

It is possible, by the use of relatively elaborate expedients, to amplitude-stabilize the operation of the electronic drive system for the tuning fork and thereby maintain the fork amplitude at a substantially constant level. However, such complicated expedients are not only costly, but also increase the possibility of malfunction in the electronic circuits.

SUMMARY OF INVENTION

In view of the foregoing, it is the main object of this invention to provide a tuning fork oscillator whose amplitude is physically stabilized by means of stop elements.

More specifically, an object of the invention is to provide a tuning fork oscillator which is sustained in vibration by an electronic drive system adapted to drive the fork well above the desired peak amplitude, the excursion of the fork being limited by a stop whose tip engages the fork at the set limit to prevent the fork from exceeding this value.

A significant advantage of the invention is that it avoids the need for elaborate and expensive circuits to stabilize the electronic drive system, for even though one uses a simple low cost electronic drive system for this purpose, the stability of the fork is nevertheless maintained by simple mechanical expedients without a significant loss of energy and without significantly degrading the efficiency of the tuning fork oscillator.

Briefly stated, these objects are attained in an oscillator constituted by a tuning fork having a pair of tines, the fork being sustained in vibration by an electronic drive system. This system includes an amplifier whose output is applied to a drive coil associated with one tine of the fork, the signal voltage generated in a pickup coil associated with the other tine being applied to the amplifier input, thereby forming a closed positive feedback loop.

The electronic drive system is arranged to overdrive the tuning fork so that the tine excursion, in the absence of physical limits, is well above the desired point. But by means of an adjustable physical stop placed adjacent the driven tine, the excursion of the tine is prevented from going beyond the point of engagement between the tip of the stop and the tine. While the electronic drive system lacks amplitude control means and is relatively unstable, inasmuch as the fork is overdriven thereby, an increase or decrease in drive current amplitude as a result of the instability of the drive system will have, within a broad range of values, no substantial effect on the actual amplitude of the fork owing to the limit thereon imposed by the mechanical stop.

In effect, a simple mechanical stop will at once reduce the effect of circuit instability, input power variations, ambient air pressure changes, and thermally caused changes in coil resistance and in the properties of the fork material.

BRIEF DESCRIPTION OF FIGURES

For a better understanding of the invention, as well as other objects and further features thereof, reference is made to the following detailed description to be read in conjunction with the accompanying drawing, wherein.

DESCRIPTION OF INVENTION

Figures 1, 2, 3, 4, 5, 6:
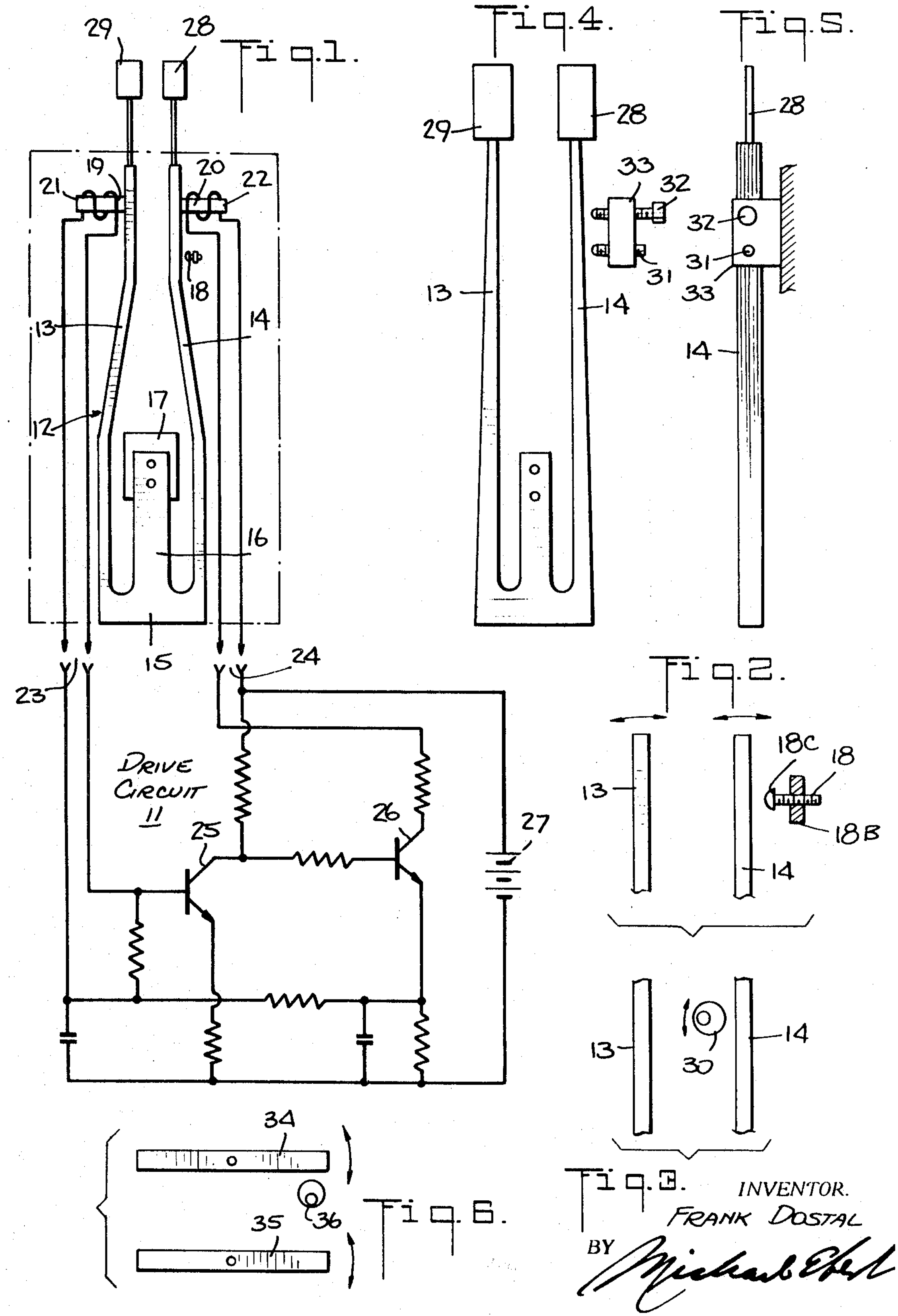
FIG. 1 is a schematic diagram of one preferred form of tuning fork oscillator in accordance with the invention wherein a tuning fork is sustained in vibration by an electronic drive system and is amplitude stabilized by a physical stop member.
FIG. 2 is an enlarged view of the screw-type stop shown in FIG. 1.
FIG. 3 illustrates a cam-type stop for limiting amplitude of the fork.
FIG. 4 illustrates, in plan view, a preferred form of stop adapted to impose an absolute limit on fork amplitude, below which limit the amplitude is adjustable.
FIG. 5 is a side view of the stop shown in FIG. 4.
FIG. 6 illustrates a stop arrangement for a torsional fork.

Referring now to FIG. 1, there is shown an amplitude-limited electromechanical oscillator in accordance with the invention, the oscillator comprising a tuning fork unit 10 and a drive circuit 11 therefor. The tuning fork 12 in the unit is constituted by a pair of flexible tines 13 and 14 interconnected by a relatively heavy base 15 having an upwardly extending stem 16 disposed midway between the tines and attached to a supporting plate 17. The amplitude of the tines is limited by a stop element 18 in a manner to be later explained.

The tuning fork is a high "Q" mechanical oscillator which vibrates at a natural frequency determined by the dimensions and properties of the tines. In practice, the fork is made of a metal having a low temperature coefficient of modulus of elasticity to render its frequency substantially insensitive to changes in ambient temperature.

The stem mounting M is so arranged that the moment of the upper end of the fork 10 is about equal to the moment of the lower end of the fork, thereby balancing out moments and rendering the fork substantially immune to shock and vibration.

Attached to tines 13 and 14 are permanent magnets 19 and 20, respectively, the plugs reciprocating within fixed coils 21 and 22. Each coil and magnet combination forms an electromagnetic transducer, coil 22 acting as a drive coil and coil 21 as a pickup coil. Coil 21 is connected through connectors 23 to the base input circuit of a first transistor 25 in the drive circuit, while coil 22 is connected through connectors 24 to the output collector circuit of the second transistor 26 of a two-stage amplifier energized by battery 27.

The circuit of the two transistors provides a positive feedback between the pickup and drive coils, whereby currents generated by movement of magnet 19 within pickup coil 21, are amplified and applied to drive coil 22 to actuate the magnet 20, thereby exciting the fork into motion. The electronic drive means forms no part of the present invention, and any known means to drive a fork or reed may be used within the context of the invention.

As pointed out previously, a simple electronic drive system, is subject to variations in electrical amplitude which generally result in variations in fork amplitude. Thus, variations of line or in battery voltage and changes in the values of the components forming the amplifier, as a result of aging or temperature, may cause a rise or fall in fork amplitude. Other factors mentioned earlier also contribute to amplitude changes.

Where the tuning fork is used to drive an optical shutter, such as one formed by vanes 28 and 29 attached to tines 13 and 14 respectively, this change in amplitude will have an adverse effect on the optical shutter, even though the frequency of fork operation is substantially constant.

In order, therefore, to stabilize the tuning fork as to amplitude, a stop 18, as shown separately in FIG. 2, is provided in connection with the driven tine 14. Stop 18 is constituted by an adjustable screw 18A mounted on a fixed standard 18B, the screw having a tip 18C of soft rubber material having good damping qualities, such as Material C1002 manufactured by Norton Research Corporation of Cambridge, Massachusetts, or Silastic RTV 891 made by the Dow-Corning Company of Midland, Michigan.

Ideally, the position of the stop is such that it is engaged by the tine at the center of percussion, but this position is not critical. In practice the electronic drive system is arranged to actuate the fork so that its amplitude is well beyond the desired limit.

For example, let us assume that the amplitude must be held to a value of 0.05 inch, peak-to-peak, in order to properly operate an optical device or other element driven by the fork. In this event, the fork is overdriven to as much as three times the desired value, i.e., to 0.15 inch, peak-to-peak.

Then by setting stop 18 to limit the excursion of the tine to 0.05 inch, even if owing to changes in the electronic drive circuit, the drive amplitude falls well below 0.15 inch or goes thereabove, the actual physical amplitude imposed on the fork by the stop will in all events hold it to the desired value of 0.05 inch. Despite the overdrive of the fork, the impact on the stop is relatively small, for during each cycle it only absorbs a small amount of energy from a fork which consumes very little energy. Because of the high Q of the fork, the tine motion remains sinusoidal.

Instead of an adjustable screw, one may employ as a stop an eccentrically mounted cam 30, as shown in FIG. 3, whose contacting surface is preferably lined with a shock absorbing material, the effective space between the surface and the tine 14 and hence the point of contact being varied by rotation of the cam.

It may, in some instances, be desirable to impose an absolute limit on the maximum tine motion, with adjustment means adapted to vary the tine amplitude below this limit. The reason for an absolute limit is to avoid excessive amplitudes which, in time, may give rise to metallurgical fatigue and subsequent fracture of the fork. To accomplish this purpose, as shown in FIGS. 4 and 5, a stop is provided having two set screws 31 and 32 mounted on a common fixed plate 33, each screw having a suitable damping tip of soft rubber or other material. Screw 31 is factory set and sealed to afford an absolute limit on maximum tine motion, so that regardless of the setting of screw 32, the tine cannot swing beyond the limit imposed by locked screw 31. Screw 32, on the other hand, may be brought closer to the tine to limit the fork motion to any desired point below the absolute limit.

The invention is not restricted to conventional tuning fork oscillators in which the tines reciprocate in a common plane, but may also be applied to a torsional fork whose tines 34 and 35 each oscillate about their longitudinal axis. In this event the cam-type stop 36 is positioned to limit the angular excursion of one tine, preferably the driven torsional tine 34 in the manner previously described.

While there has been shown and described a preferred embodiment of the invention, it will be appreciated that many changes and modifications may be made therein without, however, departing from the essential spirit of the invention.

What I claim is:

1. An amplitude-stabilized tuning fork oscillator having a predetermined peak amplitude, said oscillator comprising:

A. a tuning fork having a pair of tines,

B. an unstabilized electronic drive system operatively coupled to said fork to sustain the tines of the fork in vibration, said unstabilized system overdriving the fork to an amplitude level subject to minor variation, but whose peak value is well above said predetermined peak amplitude, and C. a mechanical stop having a contact surface which is adjustably positioned to engage one tine of said fork at a stop point to maintain said predetermined peak amplitude and to prevent said fork from going beyond said point, said stop being constituted by an eccentrically mounted cam.

2. An amplitude-stabilized tuning fork oscillator having a predetermined peak amplitude, said oscillator comprising:

A. a tuning fork having a pair of tines,

B. an unstabilized electronic drive system operatively coupled to said fork to sustain the tines of the fork in vibration, said unstabilized system overdriving the fork to an amplitude level subject to minor variation, but whose peak value is well above said predetermined peak amplitude, and X C. a mechanical stop having a contact surface which is adjustably positioned to engage one tine of said fork at a stop point to maintain said predetermined peak amplitude and to prevent said fork from going beyond said point, said stop being formed with two adjustable screws on a common mounting plate, one screw being factory-preset and sealed to provide an absolute limit, the other being adjustable to provide limit values beyond the absolute limit.

* * * * *